United States Patent [19]

Cole

[11] Patent Number: 4,633,166

[45] Date of Patent: Dec. 30, 1986

[54] BUFFER CIRCUIT SUITABLE FOR LOW VOLTAGE OPERATION

[75] Inventor: William A. Cole, Mossley, Canada

[73] Assignee: Linear Technology Inc., Burlington, Canada

[21] Appl. No.: 785,139

[22] Filed: Oct. 7, 1985

[30] Foreign Application Priority Data

Oct. 9, 1984 [CA] Canada ................................. 464986

[51] Int. Cl.⁴ .............................................. G05F 3/16
[52] U.S. Cl. .................................... 323/315; 330/288
[58] Field of Search ....................... 323/223, 265, 315; 330/288; 307/475

[56] References Cited

U.S. PATENT DOCUMENTS 4,004,244 1/1977 Schode, Jr. ......................... 323/315
4,507,573 3/1985 Nagano .............................. 323/315

Primary Examiner—Peter S. Wong
Assistant Examiner—Anita M. Ault
Attorney, Agent, or Firm—Rogers, Bereskin & Parr

[57] ABSTRACT

An integrated circuit unity gain buffer amplifier suitable for low voltage operation, in which the input signal is applied to the base of a common emitter NPN transistor first stage. The collector of the first stage is connected to the base of an emitter follower NPN transistor second stage. The emitter of the second stage is connected to the base of an emitter follower PNP transistor third stage. The collector of the first stage is loaded by a constant current source and its emitter is connected through a resistance to ground. The collector and emitter of the second and third stages respectively are connected together through a resistor to the supply voltage. The emitter of the second stage is connected through a resistance to ground. The collector of the third stage is connected both to the output terminal and to the emitter of the first stage. This allows the circuit to operate at a very low supply voltage without any transistor operating in practical saturation.

10 Claims, 2 Drawing Figures

BUFFER CIRCUIT SUITABLE FOR LOW VOLTAGE OPERATION

FIELD OF THE INVENTION

This invention relates to a buffer circuit suitable for very low voltage operation.

BACKGROUND OF THE INVENTION

Integrated circuits commonly require buffer circuits which can operate at a low supply voltage. A common difficulty in the past has been that when the battery which supplies power to the integrated circuit nears the end of its useful life, the battery voltage drops substantially. When this occurs, one or more stages of the buffer circuit may become saturated. When a stage becomes saturated, its gain falls drastically; its input bias current requirement increases, and in general the performance of the stage deteriorates enormously. The circuit ceases to perform adequately when one or more of its stages become saturated.

BRIEF SUMMARY OF THE INVENTION

Therefore it is an object of the present invention to provide a buffer circuit which is adapted to operate with a low supply voltage and which is less likely than prior art circuits to suffer from saturation of one or more of its stages. To this end the invention provides in its broadest aspect a buffer circuit adapted for operation at a low supply voltage and comprising:
(a) first, second and third transistors each having a base, emitter and collector, said transistors being selected from NPN and PNP types, said first and second transistors being of one type and said third transistor being of the other type,
(b) first and second terminal means adapted for connection to a power supply,
(c) input signal terminal means connected to the base of said first transistor, the emitter of said first transistor being connected through a first resistance means to said first terminal means,
(d) current source means connected between the collector of said first transistor and said second terminal means for loading said first transistor,
(e) the collector of said first transistor being connected to the base of said second transistor,
(f) the emitter of said second transistor being connected through second resistance means to said first terminal means,
(g) the collector of said second transistor being coupled to said second terminal means,
(h) the emitter of said second transistor being connected to the base of said third transistor,
(i) the collector of said third transistor being connected to output terminal means and also to the emitter of said first transistor,
(j) the emitter of said third transistor being connected through third resistance means to said second terminal means,
so that an input signal applied to said input signal terminal will cause a corresponding signal at said output terminal means.

BRIEF DESCRIPTION OF THE DRAWINGS

Further objects and advantages of the invention will appear from the following description, taken together with the accompanying drawings in which.

DETAILED DESCRIPTION OF PREFERRED EMBODIMENT OF THE INVENTION

Figure 1:
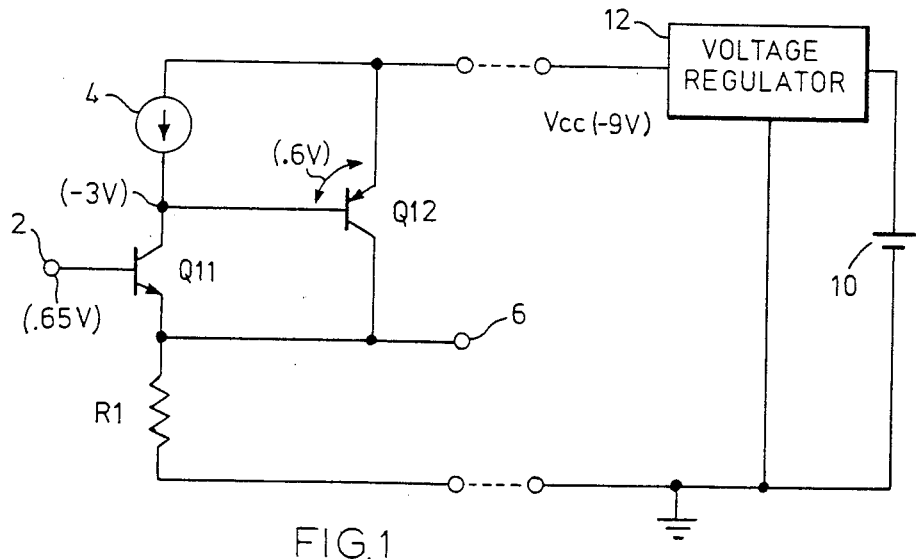
FIG. 1 is a schematic view of a typical prior art buffer circuit.

Reference is first made to FIG. 1, which shows an NPN transistor Q11 having an input signal terminal 2 connected to its base and having its collector connected to the base of a PNP transistor Q12. The collector of transistor Q11 is also connected through a current source 4 (typically a PNP transistor) to the positive terminal of a source of supply voltage Vcc. The emitter of transistor Q11 is connected through resistor R1 to ground (which is connected to the negative terminal of the supply voltage source).

The emitter of transistor Q12 is connected to the supply voltage Vcc, and the collector of transistor Q12 is connected to an output signal terminal 6 and also to the emitter of transistor Q11.

The circuit of FIG. 1 is assumed to be fabricated as an integrated circuit, in which transistors Q11, Q12, the current source 4, and resistor R1 and their connections are all deposited on a common substrate in miniature form. Since the technology of fabricating integrated circuits per se is very well known and does not form part of this invention, the mechanical construction of such integrated circuit will not be described.

In normal operation, with no transistors saturated, transistor Q11 functions as a common emitter stage, providing high gain. Transistor Q12 is a common emitter PNP stage which supplies negative feedback from its collector to the emitter of transistor Q11, so that the difference between the input and output signals is amplified by transistor Q11. The result is that the FIG. 1 circuit in normal operation functions as a unity gain non-inverting buffer amplifier.

In operation the base of transistor Q11 is typically biased to about 0.65 volts. In addition, in many circuits the supply voltage source Vcc is provided by a single battery cell 10 and a voltage regulator 12 (e.g. in hearing aids). To allow for a drop in the battery voltage near the end of the battery's life, the supply voltage Vcc should be set lower than the battery voltage near the end of the battery's life. It may therefore be desired to set voltage Vcc at about 0.9 volts.

It is well known that the base-emitter voltage of a typical integrated circuit PNP transistor such as Q12 is normally 0.6 volts. (For an integrated circuit NPN transistor the base-emitter voltage is typically 0.6 volts.) This places 0.6 volts across the current source 4 and places the collector of transistor Q11 at 0.3 volts. These voltages are all marked in parentheses in FIG. 1 for explanatory purposes.

Since the base of transistor Q11 is as indicated biased to 0.65 volts, it will be seen that the collector voltage of transistor Q11 is well below the base voltage. This places transistor Q11 in saturation.

Technically saturation occurs when the base-collector junction of a transistor is forward biased. In practice, serious degradation of the transistor's performance does not occur until the base-collector junction is forward biased by about 0.35 volts for an NPN integrated circuit transistor and about 0.4 volts for a PNP integrated circuit transistor. The precise voltage in question depends on the device geometry and the fabrication technology. The point at which such degradation occurs will be referred to as practical saturation.

In the FIG. 1 circuit it will be seen that the base-collector junction of transistor Q11 is forward biased by 0.35 volts. This causes practical saturation which is undesirable. In addition the beta constant of transistor Q12 is typically low in integrated circuits and this necessitates a higher collector current in transistor Q11 and hence higher input bias current. In addition transistor Q12 loads the collector of transistor Q11, reducing loop gain.

Figure 2:
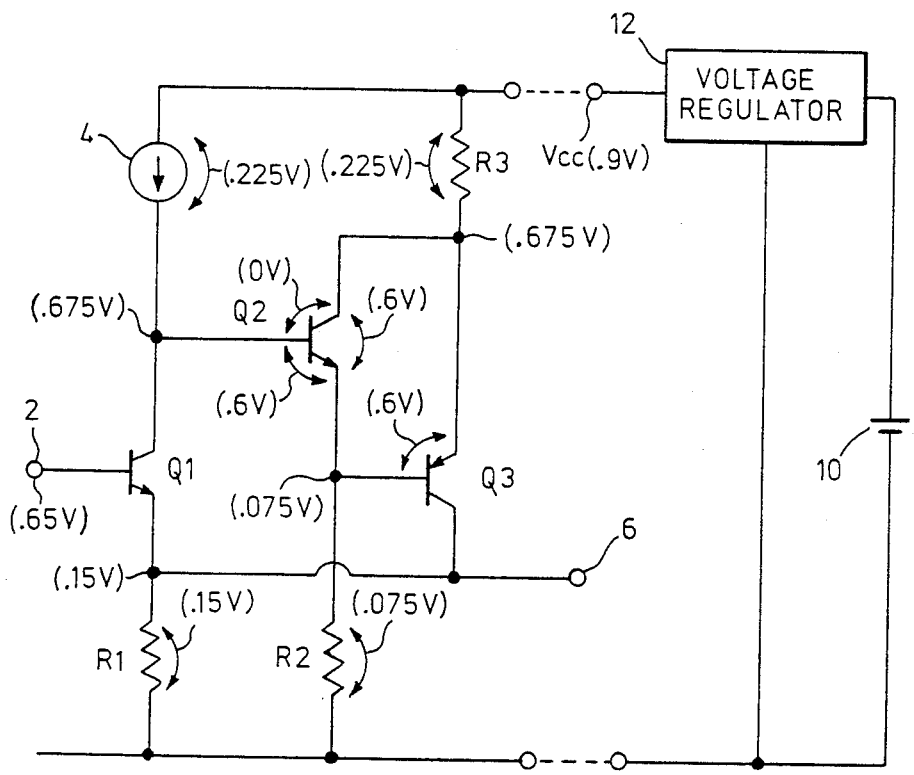
FIG. 2 is a schematic view of a preferred circuit according to the invention.

Reference is next made to FIG. 2, which shows a preferred circuit according to the invention. In FIG. 2 corresponding reference numerals indicate corresponding parts, but three transistors are provided, namely transistors Q1, Q2 and Q3. Transistor Q1 is connected in a common emitter configuration the same as transistor Q11. The collector of transistor Q1 is connected to the base of transistor Q2. Transistor Q2 has its emitter connected through resistor R2 to ground and its collector connected to the emitter of transistor Q3. The emitter of transistor Q3 is connected through resistor R3 to the supply voltage Vcc. The emitter of transistor Q2 is connected to the base of transistor Q3, and the collector of transistor Q3 is connected both to the output signal terminal 6 and to the emitter of transistor Q1.

The DC operation of the FIG. 2 circuit is as follows. As in the FIG. 1 circuit, transistor Q1 operates as a common emitter amplifier with current source 4 as an active load. The current supplied by current source 4 is chosen to be very small, typically one microampere, so that the base current of transistor Q1 is only a few nanoamperes. In addition the base of transistor Q1 is again typically biased to about 0.65 volts by an external biasing circuit (not shown). This sets the voltage across resistor R1 at 0.65 volts less the base-emitter voltage of transistor Q1. The base-emitter voltage of transistor Q1 is defined by the geometry of transistor Q1 so that the voltage across resistor R1 is typically 0.15 volts. The following equations are then applicable (ignoring base current effects, which are small), where:

VBE1 is the base-emitter voltage of transistor Q1,
VBE2 is the base-emitter voltage of transistor Q2,
VBE3 is the base-emitter voltage of transistor Q3,
VCE2 is the collector-emitter voltage of transistor Q2,
VBC2 is the base-collector voltage of transistor Q2,
I is the current supplied by current source 4,
IC2 is the collector current of transistor Q2,
IC3 is the collector current of transistor Q3,
VR1 is the voltage across resistor R1,
VR2 is the voltage across resistor R2,
VR3 is the voltage across resistor R3,
It can be seen from the circuit of FIG. 2 that $$IC2.R2 + (IC2 + IC3) R3 = Vcc - VBE3 \tag{1}$$

Also $$IC3 = 0.150/R1 - I$$

If IC3 is much greater than I, then $$IC3 \text{ to } 0.150/R1 \tag{2}$$

Combining equations 1 and 2 above, $$IC2 = \frac{Vcc - VBE3}{R2 + R3} - \frac{.15 R3}{R1 (R2 + R3)}$$

If all resistors are equal in value to resistance R, then $$IC2 = \frac{Vcc - VBE3 - .15}{2R} \tag{3}$$

Typically R=5000 ohms, so that IC2=15 μA for Vcc=0.9 volts and VBE3=0.6 volts (from equation 1). In addition, IC3=30 μA (from equation 2). These voltages, and those discussed below, are all marked in FIG. 2 for exemplary purposes.

It will be seen from FIG. 2 that $$VR3 + VCE2 + VR2 = 0.9 \text{ volts} \tag{4}$$

Now $$VR3 = (IC3 + IC2) R3 = 0.225 \text{ volts}$$

and $$VR2 = IC2.R2 = 0.075 \text{ volts}$$

Therefore from equation (4), $$VCE2 = 0.6 \text{ volts}.$$

Since VBE2=0.6 volts (for an integrated circuit NPN transistor), therefore $$VBC2 = \text{zero volts}.$$

It will thus be seen from FIG. 2 that the voltage across current source 4 is VR3+VBC2, which is 0.225 volts. This is sufficient to keep current source 4 (which is typically a PNP transistor) out of practical saturation. In addition the collector of transistor Q1 is at a potential 0.225 volts below Vcc, i.e. it is at 0.675 volts.

As noted, the base of transistor Q1 is biased at 0.65 volts. It will be seen that this is below the voltage of 0.675 volts at the collector of transistor Q1. Since the base voltage of transistor Q1 is below its collector voltage, the base collector junction remains reverse biased and transistor Q1 is not saturated.

Similarly, the collector voltage of transistor Q2 remains at zero volts above its base voltage so that transistor Q2 is not operated in saturation.

Further, the base of transistor Q3 is biased at 0.075 volts, while the collector of transistor Q3 is biased at 0.15 volts, only slightly above the base voltage so that transistor Q3 is not operated in practical saturation. The result is that no transistor of the FIG. 2 circuit is operated in practical saturation, even with Vcc as low as 0.9 volts.

The connection of the collector of transistor Q2 to the emitter of transistor Q3, rather than to Vcc allows resistor R3 to be smaller for the same voltage at the emitter of transistor Q3. This reduces the area required for resistor R3 in integrated circuit implementation and also produces some increase in open loop gain. If desired the collector of transistor Q2 could be connected directly to the supply voltage Vcc, but the arrangement shown is preferred.

The AC operation of the FIG. 2 circuit is best understood by assuming that the collector of transistor Q2 is connected to the supply voltage Vcc rather than to the emitter of transistor Q3. This simplification results in only a minor error in the derived value for open loop gain. It will then be seen that transistor Q1 acts as a common emitter stage, amplifying the difference between the input and output signals. The current source 4 is an active load for transistor Q1, providing high gain (typically 200).

Transistor Q2 in combination with resistor R2 acts as an emitter follow impedance buffer and level shifter. Transistor Q3 is connected in a common emitter configuration with emitter degeneration resistor R3. Resistor R1 serves as the collector load for transistor Q3. It will be seen that with a gain of 200 in the first stage and approximately unity gain in the following stages, the output voltage must closely follow the input voltage, in accordance with conventional feedback theory. Conventional feedback theory also indicates that the output impedance is approximately R1/200 (since the loop gain is 200) or 25 ohms. The feedback will also multiply the input impedance of transistor Q1 by approximately 200.

The concentration of all of the gain in the first stage, and the use of local feedback in the third stage, ensures that the circuit is stable under closed loop conditions.

Although transistors Q1 and Q2 have been shown as NPN transistors and Q3 as a PNP transistor, this can if desired be reversed.

I claim:

1. A buffer circuit adapted for operation at a low supply voltage and comprising:
   (a) first, second and third transistors each having a base, emitter and collector, said transistors being selected from NPN and PNP types, said first and second transistors being of one type and said third transistor being of the other type,
   (b) first and second terminal means adapted for connection to a power supply,
   (c) input signal terminal means connected to the base of said first transistor, the emitter of said first transistor being connected through a first resistance means to said first terminal means,
   (d) current source means connected between the collector of said first transistor and said second terminal means for loading said first transistor,
   (e) the collector of said first transistor being connected to the base of said second transistor,
   (f) the emitter of said second transistor being connected through second resistance means to said first terminal means,
   (g) the collector of said second transistor being coupled to said second terminal means,
   (h) the emitter of said second transistor being connected to the base of said third transistor,
   (i) the collector of said third transistor being connected to output terminal means and also to the emitter of said first transistor,
   (j) the emitter of said third transistor being connected through third resistance means to said second terminal means, so that an input signal applied to said input signal terminal will cause a corresponding signal at said output terminal means.

2. A circuit according to claim 1 wherein the collector of said second transistor is connected directly to the emitter of said third transistor, the collector of said second transistor and the emitter of said third transistor both being connected through said third resistance means to said second terminal means.

3. A circuit according to claim 1 wherein said first, second and third resistance means are all substantially equal in resistance.

4. A circuit according to claim 1 wherein said first and second transistor are NPN transistors and said third transistors is a PNP transistor.

5. A circuit according to claim 1 wherein said first and second transistors are PNP transistors and said third transistor is a NPN transistor.

6. A buffer circuit which operates at a low supply voltage and comprising:
   (a) a source of supply voltage comprising a single battery cell and a voltage regulator connected to said battery, said battery being of a type the voltage of which may fall as low as one volt near the end of the life of said battery, said source having first and second terminal means for supplying a regulated voltage,
   (b) first, second and third transistors each having a base, emitter and collector, said transistors being selected from NPN and PNP types, said first and second transistors being of one type and said third transistor being of the other type,
   (c) input signal terminal means connected to the base of said first transistor, the emitter of said first transistor being connected through a first resistance means to said first terminal means,
   (d) current source means connected between the collector of said first transistor and said second terminal means for loading said first transistor,
   (e) the collector of said first transistor being connected to the base of said second transistor,
   (f) the emitter of said second transistor being connected through second resistance means to said first terminal means,
   (g) the collector of said second transistor being coupled to said second terminal means,
   (h) the emitter of said second transistor being connected to the base of said third transistor,
   (i) the collector of said third transistor being connected to output terminal means and also to the emitter of said first transistor,
   (j) the emitter of said third transistor being connected through third resistance means to said second terminal means, so that an input signal applied to said input signal terminal will cause a corresponding signal at said output terminal means.

7. A circuit according to claim 6 wherein the collector of said second transistor is connected directly to the emitter of said third transistor, the collector of said second transistor and the emitter of said third transistor both being connected through said third resistance means to said second terminal means.

8. A circuit according to claim 6 wherein said first, second and third resistance means are all substantially equal in resistance.

9. A circuit according to claim 6 wherein said first and second transistors are NPN transistors and said third transistor is a PNP transistor.

10. A circuit according to claim 6 wherein said first and second transistors are PNP transistors and said third transistor is a NPN transistor.

* * * * *